United States Patent [19]
Castello et al.

[11] Patent Number: 5,332,937
[45] Date of Patent: Jul. 26, 1994

[54] TRANSCONDUCTOR STAGE FOR HIGH FREQUENCY FILTERS

[75] Inventors: Rinaldo Castello, Arcore; Roberto Alini, Stradella; Andrea Baschirotto, Tortona; Gianfranco Vai, Pavia, all of Italy

[73] Assignee: SGS-Thomson Microelectronics, S.r.l., Agrate Brianza, Italy

[21] Appl. No.: 942,678

[22] Filed: Sep. 9, 1992

[30] Foreign Application Priority Data

Nov. 13, 1991 [IT] Italy ............................ MI91A003018

[51] Int. Cl.$^5$ ............................................. H03K 5/24
[52] U.S. Cl. ........................................ 307/520; 307/521; 307/355; 307/495; 328/167; 330/109
[58] Field of Search ............... 307/520, 521, 495, 355, 307/570; 328/167; 330/109, 107, 306

[56] References Cited
U.S. PATENT DOCUMENTS

| | | | |
|---|---|---|---|
| 4,523,110 | 6/1985 | Johnson | 307/355 |
| 4,626,794 | 12/1986 | Sugimoto | 330/300 |
| 4,823,092 | 4/1989 | Pennock | 330/300 |
| 4,839,542 | 6/1989 | Robinson | 307/520 |
| 4,926,139 | 5/1990 | Anderson et al. | 330/306 |
| 4,962,323 | 10/1990 | Ta | 307/355 |
| 5,032,744 | 7/1991 | Liu | 307/530 |
| 5,095,284 | 3/1992 | Mead | 330/253 |
| 5,101,126 | 3/1992 | Butler et al. | 307/495 |
| 5,192,884 | 3/1992 | Kusano | 330/107 |

*Primary Examiner*—Timothy P. Callahan
*Assistant Examiner*—Dinh Le
*Attorney, Agent, or Firm*—Robert Groover

[57] ABSTRACT

A transconductor differential stage for high-frequency filters, which has a MOS differential input pair with common sources. The drain of each MOS input is connected to the emitter of an npn bipolar. These two matched bipolars have their gates connected together with the gate of a third bipolar, which is diode-connected. Two matched current sources feed the two bipolars, and a third current source feeds the third bipolar. A single controlled current sink is connected to the sources of both MOS input transistors, and also (through a resistor) to the third bipolar.

22 Claims, 2 Drawing Sheets

TRANSCONDUCTOR STAGE FOR HIGH FREQUENCY FILTERS

BACKGROUND AND SUMMARY OF THE INVENTION

The present invention relates to high-frequency continuous-time filters (of the type which comprises an input circuit portion having signal inputs and an output circuit portion), and more particularly to differential stages therefor.

The field of application of the disclosed innovative differential circuit is particularly, but not solely, related to monolithically integrated, time-continuous band-pass filters, and the description to follow will make reference to this field of application for convenience of illustration.

In recent years, several techniques have been proposed for making integrated time-continuous filters. Of these techniques, that using a transconductor[1] stage for the filter base block is outstanding.

[1] A transconductor is a voltage-controlled variable-transconductance stage. It is an integral part of the operational transconductance amplifier "OTA") which is a voltage-controlled current-source amplifier. Transconductors are used in active filters, and also in gyrators, oscillators, and circuits for impedance transformation. See generally J. Scott, ANALOG ELECTRONIC DESIGN (1991), which is hereby incorporated by reference. Some specific examples of the literature on transconductor designs, and their application to continuous-time filters, includes the following, all of which are hereby incorporated by reference: Silva-Martinez et al., "A large-signal very low-distortion transconductor for high-frequency continuous-time filters," IEEE JOURNAL OF SOLD-STATE CIRCUITS vol.26, no.7 p.946–55 (Jul. 1991); Tanimoto et al., "Realization of a 1-V active filter using a linearization technique employing plurality of emitter-coupled pairs," IEEE JOURNAL OF SOLID-STATE CIRCUITS vol.26, no.7 p.937–45 (Jul. 1991); Castello et at., "A very linear BiCMOS transconductor for high-frequency filtering applications," in the 1990 IEEE INTERNATIONAL SYMPOSIUM ON CIRCUITS AND SYSTEMS vol.2, pp.1364–7; Perry, "A flexible transconductor-capacitor filter demonstrator," in the 1989 IEEE INTERNATIONAL SYMPOSIUM ON CIRCUITS AND SYSTEMS vol.2. p.1075–8; Haigh et al., "Continuous-time and switched capacitor monolithic filters based on current and charge simulation," IEE PROCEEDINGS G (Circuits, Devices and Systems) vol.137, no.2 p.147–55 (1990); de Heij et at., "Transconductor and integrator circuits for integrated bipolar video frequency filters," 1989 IEEE INTERNATIONAL SYMPOSIUM ON CIRCUITS AND SYSTEMS vol.1 p.114–17; Perry. "An integrated continuous-time bipolar transconductor-capacitor filter," 24 IEEE JOURNAL OF SOLID-STATE CIRCUITS p.732-5 (June 1989); Nedungadi et al., "High-frequency voltage-controlled continuous-time lowpass filter using linearised CMOS integrators," 22 ELECTRONICS LETTERS no.14 p.729-31 (3 Jul. 1986); and Czarnul et at., "MOS tunable transconductor," 22 ELECTRONICS LETTERS no.13 p.721-2 (19 Jun. 1986).

Such a technique appears to be the most effective in high frequency applications. This is probably attributable to the fact that, in a transconductor filter, the voltage-to-current conversion phase takes place in an open loop, so that the so-called non-dominant pole of the converter is not restricted by the unitary frequency gain of an operational amplifier, as is instead the case with filters in the MOSFET-C technology.

However, transconductor filters have a drawback in that they are especially responsive to stray capacitances, particularly on account of being operated in an open loop fashion. This restricts their passband, especially at high frequencies.

The underlying technical problem of this invention is to provide a new transconductor differential stage which has such structural and performance characteristics as to overcome the drawbacks with which the prior art approaches have been beset, but without giving up any of their well-recognized advantages.

The preferred embodiment of the invention provides a differential stage using a mixed bipolar-MOS technology. The input portion comprises a pair of MOS transistors whose gate terminals coincide with said signal inputs, and the output portion comprises a pair of bipolar transistors arranged with their bases in common. The drain of each MOS input transistor is connected to the emitter of an npn bipolar. These two matched bipolars have their gates connected together with the gate of a third bipolar, which is diode-connected. Two matched current sources feed the two bipolars, and a third current source feeds the third bipolar. A single controlled current sink is connected to the sources of both MOS input transistors, and also (through a resistor) to the third bipolar.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 3:
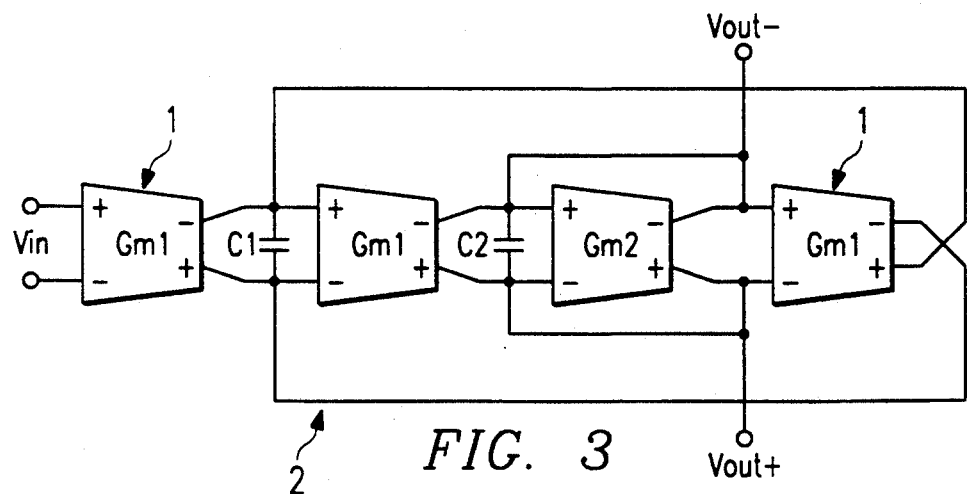
FIG. 3 is a diagrammatic representation of a band-pass filter incorporating the differential stage shown in FIG. 1.

With reference to the drawing views, generally and schematically shown at 1 (in FIGS. 1 and 2) is a transconductor differential stage. This stage can be advantageously incorporated in a band-pass filter 2, as shown in FIG. 3. The stage 1, in the presently preferred embodiment, is formed with a so-called mixed technology, i.e. includes both bipolar and MOS transistor types.

The stage 1 comprises an input circuit portion consisting of a pair of N-channel MOS transistors M1, M2 having respective source terminals arranged in common to provide a circuit node P3.

The gate terminal G1 of the first transistor M1 constitutes a non-inverting input for the differential stage 1, and the gate G2 of the other transistor M2 is the inverting input. Between node P3 and ground there is provided a current generator (sink) A1 whose value, given by the relation $I_{A1} = 2\ Io + ID$, is dependent on that of other current sources provided in the stage 1 and described hereinbelow.

The stage 1 also includes an output circuit portion comprised of a pair of npn bipolar transistors Q1 and Q2 having respective bases B1, B2 connected to each other.

The MOS transistors M1 and M2 have respective drain terminals P1, P2 connected each to a corresponding one of the bipolar transistors Q1, Q2.

These bipolar transistors Q1, Q2 are connected in the stage 1 in a so-called cascode configuration and have respective emitters E1, E2 mutually connected to the aforesaid drain terminals P1, P2 of the MOS transistor pair.

On the other hand, the collectors C1 and C2 of transistors Q1, Q2 form output terminals for the stage 1, and are each supplied from a respective current source Io.

The structure of stage 1 is completed by a third transistor Q3, of the npn bipolar type, which has its base B3 connected to the bases B1 and B2 and its emitter E3 connected to the node P3 through a voltage source, such as a battery E.[2] This third transistor has its collector C3 connected, in turn, to a current source ID; further, the transistor Q3 is in a diode configuration with the base B3 and the collector C3 connected to each other.

Figure 1:
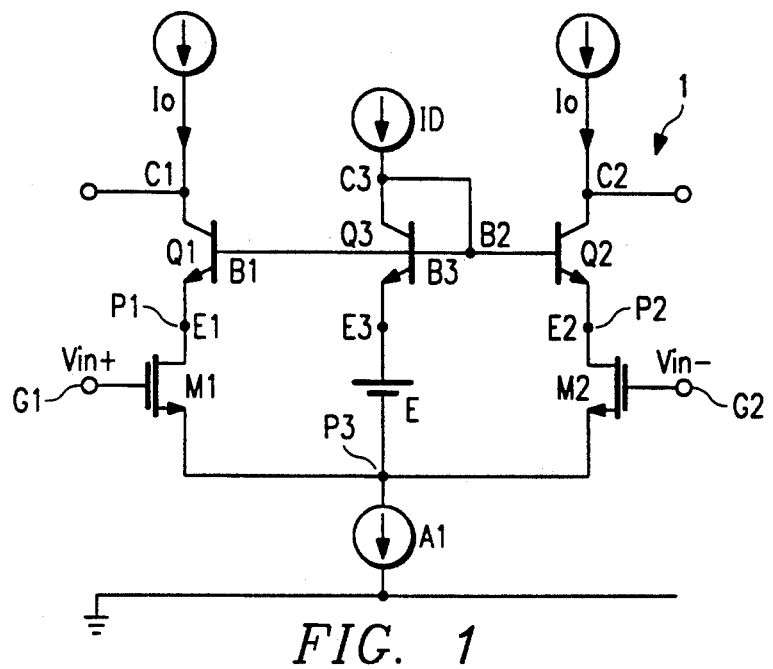
FIG. 1 is a simplified diagram illustrating a differential stage which embodies this invention.

[2] In FIG. 1 this voltage source is shown as a battery, for conceptual clarity; but of course this would not normally be practical for integrated circuit realization. In the preferred embodiment a resistor is used to provide this voltage, but a nonlinear element or subcircuit could alternatively be used instead.

The operation of the inventive differential stage will now be described.

The input transistors M1, M2 are biased in the linear operation range, whereby they perform a linear voltage-to-current conversion to set the transconductance value for the stage 1.

On the other hand, the value of the battery E, being some hundreds of millivolts, sets the drain-to-source voltage drop Vds for transistors M1 and M2.

Under linear conditions, the values of the currents I1 and I2 flowing through said transistors is given by the following equation:

$$I1 = I2 = \mu C_{ox}[(Vgs - Vt)Vds - (Vds)^2/2]W/L$$

where Vgs is the gate-to-source voltage drop; Vt is the threshold voltage; W and L are the width and length, respectively, of the transistor channel region; and $\mu$ and $C_{ox}$ are known parameters of each transistor.

When a differential signal is applied to the inputs G1 and G2 of stage 1, the stage transconductance value gm can be computed as the incremental ratio of the variation in output current Iout to variation in the input voltage Vin = Vgs(M1) − Vgs(M2); thus $$gm = \delta Iout/\delta Vin = \mu C_{ox} Vds\, W/L.$$

Consider an initial state wherein the same current Io flows through the three bipolar transistors Q1, Q2 and Q3: since the three transistors have their bases in common, it can be inferred that their emitters E1, E2 and E3 are also at the same potential.

Consequently, the drain-to-source voltage drop Vds for the MOS transistors M1, M2 will coincide with the battery value E.

Upon application of a signal on the inputs G1 and G2, the signal will change the values of currents I1, I2 flowing through the two input transistors M1, M2, causing an attendant variation in the drain-to-source voltage drop Vds thereof as well. Since the voltage drops across the nodes P1-P3 and P2-P3 can no longer be regarded as constant, the input signal would be distorted due to the relationship between the output current and the input voltage being no longer a linear one.

However, the presence of the bipolar transistors Q1, Q2 tends to minimize the variations of the potentials at P1 and P2. This is because the variation in the base-to-emitter voltage drops Vbe of such transistors—as brought about by currents I1 and I2—is materially smaller than the variations in the drain-to-source voltage drops Vds of the MOS transistors M1 and M2. To minimize impedance at the nodes P1 and P2 and maintain high slew rates, the bipolar transistors Q1 and Q2 are utilized as cascode devices.

Another less-than-ideal behavior of the conventional transconductor is due to its finite response rate bringing about an excessive phase error. By the provision of the bipolar transistors, the frequency limitation on the stage 1 only comes from the MOS transistor input portion, namely fo = ½π Tf, where Tf = L²/μ Vds is the passage time of the signal through the input portion, whereby a so-called parasitic or non-dominant pole is obtained at about 2 GHz.

In summary, the bipolar transistors Q1 and Q2 not only maintain the bias on the nodes P1, P2, but also improve the frequency performance of the stage 1.

Thus, the distortion introduced by the input signal can be compensated for and minimized by optimum selection of the input MOS transistor bias. The variation due to the drain-to-source voltage signal is therefore marginal compared to the value of this voltage in the rest condition.

The value of the variation in said drain-to-source voltage can also be obtained from the following relation:

$$\delta Vds = Vt\, \ln\,[(Io + \delta Io)/(Io - \delta Io)].$$

Another cause for phase error is the transmission zero due to the resistance of the source terminals and the stray capacitances present between the gate and the drain of the two input MOS transistors.

Figure 2:
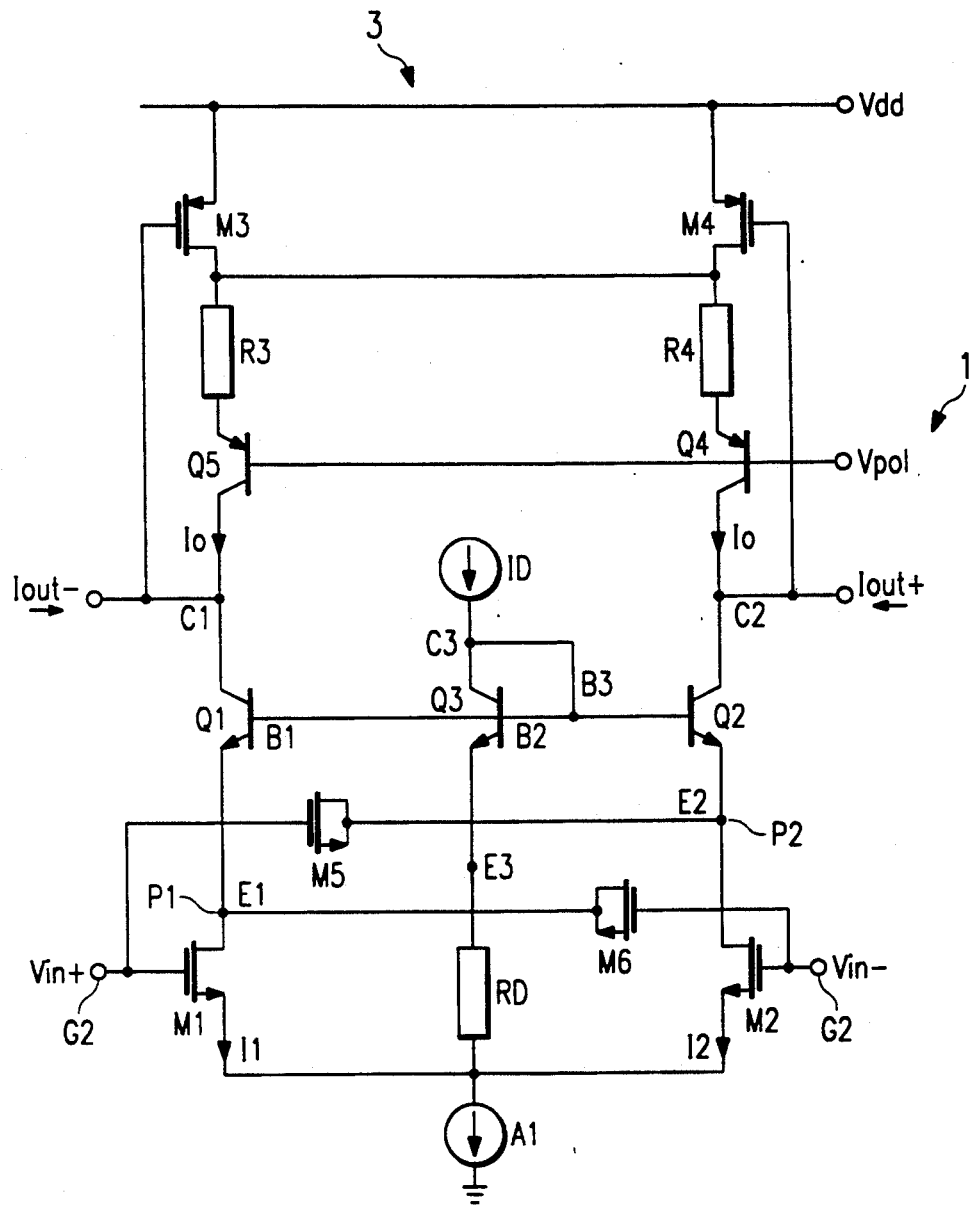
FIG. 2 is a more detailed diagram of the stage in FIG. 1.

This is obviated by the differential stage shown in FIG. 2, which has an additional pair of MOS transistors M5, M6, called dummies because each of them has its respective source and drain terminals connected to one of the nodes P1, P2. More specifically, transistor M5 has its source and drain coupled to the node P2 and has its gate terminal connected to the gate G1 of transistor M1. The other dummy transistor M6 has its source and drain connected to node P1 and has its gate terminal connected to the gate G2 of transistor M2.

These additional transistors M5, M6 have preferably an area equal to one half that of the corresponding input MOS transistors M1, M2, and inject into the nodes P1, P2 signals opposite in sign to the input signal, thereby compensating for the phase error. In all cases, a suitable selection of the areas will set the target transconductance value gm.

The structure of the transconductor stage shown in FIG. 2 is completed by a feedback circuit 3 called CMFB (Common Mode Feed-Back) which comprises a pair of P-channel MOS transistors M3, M4, and pnp transistors Q5, Q4 (driven in a current mirror configuration by input signal Vpol) and their corresponding resistors R3, R4.

Also, battery E is replaced by a resistor RD having a value $R_{RD}$ selected to satisfy the equality:

$$R_{RD} Io = E.$$

It can be appreciated that in order to obtain a varying transconductance gm, it is sufficient that the third transistor Q3 be acted upon to change the voltage drop across the resistor RD. In this case, for the stage 1 to operate properly, it is important that a true match be struck between the varying current Id and the corresponding fraction of the current. $I_{A1} = 2$ Io + ID drawn by current sink A1. As will be readily apparent to those skilled in the art, this will require an accurate construction of the current mirrors associated with the stage.

For completeness of illustration, FIG. 3 shows a sample embodiment of a time-continuous low-pass filter 2 incorporating transconductor differential stages according to the invention.

The filter 2 is of the second order. It comprises a biquadratic differential cell, and has a cut-off frequency fo which can be selected, e.g. by varying the bias, within the 8 MHz to 32 MHz band.

For each stage of this filter 2, the transconductance characteristics have been indicated. In this specific case, the preferred values have the ratio gm1=2gm2.

For example, to achieve a 25 MHz cutoff, these transconductances would be selected so that gm1 is 800 $\mu$A/V, and capacitors C1 and C1 are both 5 pF.

The transconductor stage of this invention has excellent performance, being able to handle wide input signal swings without causing distortion and non-ideality. In addition, by being adapted to handle wide signals, it requires no output amplification apt to affect the noise figure.

Further advantages come from its ability to operate in a linear mode within a broad range of frequencies, and from having a so-called non-dominant pole in the gigahertz range, specifically 2 GHz.

Low-pass filters implemented by incorporating the inventive stage thereto have proved specially effective within a frequency range of 8 to 32 MHz, showing a gain of about 50 dB, which allows differential signals of up to 3 V (p—p) to be handled at a distortion of less than 2% using a 5-Volt supply.

The filter has been implemented with a BiCMOS technology at 2 $\mu$m, and has proved its value both in terms of reduced circuit area requirements and of power dissipation, which can be as low as 30 mW at a cut-off frequency of 25 MHz.

In this sample implementation, the following specific values were used. However, of course, many changes can be made in these parameters, which are purely exemplary.

W/L for transistors M1 and M2: 90/2 $\mu$m.
$V_T$ for transistors M1 and M2: 0.75 V.
Active area of transistors Q1 and Q2 (each): 50 ($\mu$m)$^2$.
Active area of transistor Q3: 25 ($\mu$m)$^2$.
Value of current Io: 600 $\mu$A.
Value of current ID: 300 $\mu$A.
Value of resistor RD: 900$\Omega$ (P-implanted).
Active area of transistors Q5 and Q4 (each): 50 ($\mu$m)$^2$.
Value of resistors R3 and R4 (each): 400$\Omega$ (P-implanted).
W/L of PMOS transistors M3 and M4: 200/2 $\mu$m.
$V_T$ of PMOS transistors M3 and M4: 1 V.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the flail scope of variations in the disclosed novel concepts.

As will be readily appreciated by those skilled in the art of analog circuit design, the concepts illustrated in FIG. 1 can be implemented in a tremendous variety of circuit configurations, which may or may not contain the specific elements of FIG. 2. For example, a wide variety of other CMFB circuits can be added, or other feedback circuit stages can be used, instead of, or in addition to, those specifically shown and described.

Alternatively, the differential stages of this circuit can be implemented with electronic components dual to those described above (namely with P-channel MOS transistors and/or pnp bipolar transistors.)

Note also that the innovative filter of FIG. 3 is only one example of a wide variety of possible filter circuit embodiments. As will be recognized by those skilled in the art, the disclosed innovative circuit configuration can be used to implement a wide variety of filter designs. In particular, due to the dependence of transconductance on $I_D$ and $I_{A1}$ (as discussed above), transconductance can even be varied dynamically by incorporating appropriate controllable current sources (as long as the current balance is preserved, as discussed above).

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
    first and second matched current sources, and a third current source;
    first and second matched insulated-gate field-effect transistors (IGFETs), each connected to receive a respective side of a complementary input signal on a gate thereof; and
    first and second matched bipolar transistors;
    a current sink controlled to sink a current equal to the sum of said first, second, and third current sources;
    said first IGFET, first bipolar, and first current source all being connected in series, and connected to said current sink, and operatively connected to a first output terminal;
    said second IGFET, second bipolar, and second current source all being connected in series, and connected to said current sink;
    a third bipolar transistor which is diode-connected, and connected to sink current from said third current source; and
    a voltage source connected between said third bipolar transistor and said current sink;
    said first, second, and third bipolar transistors all having respective bases thereof connected together.

2. The integrated circuit of claim 1, wherein said voltage source consists essentially of a resistor carrying a constant current.

3. The integrated circuit of claim 1, wherein said first IGFET is n-channel and has a source connected to said current sink, and a drain connected to the emitter of said first bipolar; and said first bipolar is npn and has a collector connected to said first current source and also operatively connected to provide a first output terminal; and said second IGFET is n-channel and has a source connected to said current sink and a drain connected to the emitter of said second bipolar, and said second bipolar is npn and has a collector connected to said second current source.

4. The integrated circuit of claim 1, wherein said collector of said second bipolar is also operatively connected to provide a second output terminal.

5. An integrated circuit, comprising:
first and second matched current sources, and a third current source;
first and second matched insulated-gate field-effect transistors (IGFETs), each connected to receive a respective side of a complementary input signal on a gate thereof; and
first and second matched bipolar transistors;
a current sink controlled to sink a current equal to the sum of said first, second, and third current sources;
said first IGFET, first bipolar, and first current source all being connected in series, and connected to said current sink, and operatively connected to a first output terminal;
said second IGFET, second bipolar, and second current source all being connected in series, and connected to said current sink, and operatively connected to a second output terminal;
a third bipolar transistor which is diode-connected, and connected to sink current from said third current source; and
a voltage source connected between said third bipolar transistor and said current sink;
said first, second, and third bipolar transistors all having respective bases thereof connected together;
said first and second current sources each incorporating a respective transistor whose conductivity is modulated by a respective one of said first and second output terminals.

6. The integrated circuit of claim 5, wherein said collector of said second bipolar is also operatively connected to provide a second output terminal.

7. The integrated circuit of claim 5, wherein said voltage source consists essentially of a resistor carrying a constant current.

8. The integrated circuit of claim 5, wherein said first IGFET is n-channel and has a source connected to said current sink, and a drain connected to the emitter of said first bipolar; and said first bipolar is npn and has a collector connected to said first current source and also operatively connected to provide a first output terminal; and said second IGFET is n-channel and has a source connected to said current sink and a drain connected to the emitter of said second bipolar, and said second bipolar is npn and has a collector connected to said second current source.

9. An integrated circuit, comprising:
first and second mutually matched current sources, and a third current source;
first and second mutually matched n-channel insulated-gate field-effect transistors (IGFETs), each connected to receive a respective side of a complementary input signal on a gate thereof; and
third and fourth mutually matched IGFETs, each having approximately one-half the channel area of said first IGFET, and
first and second mutually matched bipolar transistors;
a current sink controlled to sink a current equal to the sum of said first, second, and third current sources;
said first IGFET, first bipolar, and first current source all being connected in series, and connected to said current sink, and operatively connected to a first output terminal;
said second IGFET, second bipolar, and second current source all being connected in series, and connected to said current sink;
a third bipolar transistor which is diode-connected, and connected to sink current from said third current source; and
a resistor connected between said third bipolar transistor and said current sink;
said first, second, and third bipolar transistors all having respective bases thereof connected together; and
said third IGFET being connected between the gate of said first IGFET and the drain of said second IGFET, and said fourth IGFET being connected between the drain of said first IGFET and the gate of said second IGFET.

10. The integrated circuit of claim 9, wherein said first IGFET has a source connected to said current sink, and a drain connected to the emitter of said first bipolar; and said first bipolar has a collector connected to said first current source and also operatively connected to provide a first output terminal; and said second IGFET has a source connected to said current sink and a drain connected to the emitter of said second bipolar, and said second bipolar has a collector connected to said second current source.

11. The integrated circuit of claim 9, wherein said collector of said second bipolar is also operatively connected to provide a second output terminal.

12. A transconductor differential stage for high-frequency filters, comprising:
an input circuit portion comprising a pair of MOS transistors having gate terminals connected to receive signal inputs;
an output circuit portion, comprising a pair of output terminals, and a pair of bipolar transistors each connected in series between a respective one of said MOS transistors and a respective one of said output terminals, said pair of bipolar transistors having their bases connected together; and
an additional pair of MOS transistors, each having respective source and drain terminals connected to a corresponding drain terminal of one transistor in said first pair of input transistors, and a respective gate terminal cross-connected to the gate terminal of the other transistor in said first pair.

13. A differential stage according to claim 12, further comprising bias circuitry connected to bias said MOS transistors in the linear operating range thereof.

14. A differential stage according to claim 12, wherein said bipolar transistors are connected with said MOS transistors in a cascode configuration.

15. A differential stage according to claim 12, characterized in that said bipolar transistors have respective emitters connected each to a corresponding drain terminal of said MOS transistors.

16. A differential stage according to claim 12, comprising an additional bipolar transistor having its base in common with said bipolar transistors and its emitter connected to the sources of said MOS transistors via a voltage source.

17. A differential stage according to claim 12, wherein the collectors of said bipolar transistors are connected to provide differential outputs.

18. A differential stage according to claim 16, wherein said voltage source is a resistor carrying an adjustable constant current.

19. A differential stage according to claim 16, wherein said additional bipolar transistor is arranged in a diode configuration with the base and collector terminals connected to each other.

20. A differential stage according to claim 16, wherein said pair of bipolar transistors and said additional bipolar transistor are all of the npn type.

21. A band-pass filter, comprising at least one transconductor stage which comprises:
- an input circuit portion comprising a pair of MOS transistors having gate terminals connected to receive signal inputs;
- an output circuit portion, comprising a pair of output terminals, and a pair of bipolar transistors each connected in series between a respective one of said MOS transistors and a respective one of said output terminals, said pair of bipolar transistors having their bases connected together; and
- an additional bipolar transistor having its base in common with said bipolar transistors and its emitter connected to the sources of said MOS transistors via a voltage source.

22. An integrated circuit continuous-time filter, comprising:
- multiple transconductor stages connected to implement a desired transfer function;
wherein multiple ones of said transconductor stages each comprise a mixed-technology differential stage which includes:
- first and second matched current sources, and a third current source;
- first and second matched insulated-gate field-effect transistors (IGFETs), each connected to receive a respective side of a complementary input signal on a gate thereof: and
- first and second matched bipolar transistors;
- a current sink controlled to sink a current equal to the sum of said first, second, and third current sources;
- said first IGFET, first bipolar, and first current source all being connected in series, and connected to said current sink, and operatively connected to a first output terminal;
- said second IGFET, second bipolar, and second current source all being connected in series, and connected to said current sink;
- a third bipolar transistor which is diode-connected, and connected to sink current from said third current source; and
- a voltage source connected between said third bipolar transistor and said current sink;
- said first, second, and third bipolar transistors all having respective bases thereof connected together.

* * * * *